US006396363B1

(12) United States Patent
Alexanian et al.

(10) Patent No.: US 6,396,363 B1
(45) Date of Patent: May 28, 2002

(54) PLANAR TRANSMISSION LINE TO WAVEGUIDE TRANSITION FOR A MICROWAVE SIGNAL

(75) Inventors: Angelos Alexanian, Boston, MA (US); Nitin Jain, Karnataka (IN); Thomas Budka, Shirley, MA (US)

(73) Assignee: Tyco Electronics Corporation, Wilmington, DE (US)

( * ) Notice: Subject to any disclaimer, the term of this patent is extended or adjusted under 35 U.S.C. 154(b) by 0 days.

(21) Appl. No.: 09/465,644

(22) Filed: Dec. 17, 1999

Related U.S. Application Data

(60) Provisional application No. 60/112,793, filed on Dec. 18, 1998.

(51) Int. Cl.$^7$ .............................. H03H 5/00; H03H 7/38

(52) U.S. Cl. ............................................ 333/26; 333/34

(58) Field of Search ................................. 333/21 R, 34, 333/26, 238, 246

(56) References Cited

U.S. PATENT DOCUMENTS 4,754,239 A * 6/1988 Sedivec ....................... 333/26
4,901,040 A * 2/1990 Ahlborn et al. ............... 333/26

* cited by examiner

*Primary Examiner*—Robert Pascal
*Assistant Examiner*—Kimberly E Glenn

(57) ABSTRACT

A transition from a planar transmission line to a waveguide has a planar transmission line patterned onto a glass substrate. A mode transformer 1 on the substrate 3 is electrically connected to a transmission line 2 and converts a transverse electric or quasi-transverse electric mode signal carried by the transmission line to a waveguide mode signal. A combination of a first extension of the substrate 3 and a dielectric portion having some depth makes up a first impedance matching element 13. A second impedance matching element 14 is a combination of a second extension of the substrate 3 and a dielectric portion having another depth greater than the first depth. The aperture created by the second impedance matching element launches an RF signal into the air for use as a wireless communication signal. Also disclosed is a method for optimizing a transition according to the teachings of the present invention for alternative dimensions and dielectrics.

12 Claims, 3 Drawing Sheets

PLANAR TRANSMISSION LINE TO WAVEGUIDE TRANSITION FOR A MICROWAVE SIGNAL

This application claims the benefit of U.S. Provisional Application No. 60/112,793 filed Dec. 18, 1998.

BACKGROUND

Many wireless communication systems use microwave integrated circuits (MIC) and multichip microwave modules to generate and process transmitted and received communication signals. Wireless communication signals generally occupy the RF and microwave frequencies of the spectrum, although developments in wireless communications include the implementation of systems and signals operating in the millimeter wavelength frequency range. As wireless communication becomes more prevalent, it is desirable to reduce the physical size of the communication devices so they can be installed into daily operations unobtrusively. Accordingly, there is industry pressure to miniaturize microwave integrated circuits and microwave multichip modules that make up constituent parts of wireless communication devices and systems. It is also desirable to integrate functionality of the MICs and microwave multichip modules and supporting circuitry into smaller packages. A wireless communication signal generated on an MIC requires an appropriate launch into the air for practical use. Conventionally, an electronic signal is carried via a coaxial connection from the transmitter/receiver circuit to an external antenna in order to achieve adequate signal integrity in the process of the signal launch. In the interest of further system integration and miniaturization, however, it is desirable to integrate an MIC and microwave multichip module with a waveguide launch, so a signal may be launched and received directly to and from the MIC and microwave multichip module. There is a need, therefore, for a practical method for conversion of an RF, microwave, or millimeter wave signal from a signal on an MIC to a radiated wave suitable for launch as a communications signal. There is a need, therefore, for a practical conversion from a signal travelling in a conductive metal strip or wire directly to a waveguide that may be part of the microwave multichip module and then air.

A known conversion is an E-field or E-plane probe method in which the center conductor of a coaxial cable or a coplanar line is positioned in the interior of a waveguide cavity. One end of the waveguide cavity is shorted. Signals in the probe produce an electric field and excite fields in the waveguide that are directly related to the signal. Accordingly, a certain amount of direct coupling can be achieved. Disadvantageously, the E-field probe method of transformation is bandwidth limited and requires complex assembly that is relatively intolerant to manufacturing tolerances due to the importance of the position of the probe in the cavity to achieve maximum coupling.

Another known conversion is disclosed in U.S. Pat. Nos. 2,825,876, 3,969,691, and 4,754,239 and is termed a "ridge transition". The ridge transition comprises a signal line supported by a dielectric substrate and positioned parallel to a ground plane on an opposite side of the dielectric in a microstrip configuration. An end of the microstrip abuts a waveguide cavity and a conducting ridge is positioned at the end of the microstrip and within the waveguide cavity. Although this method produces the desired conversion from microstrip to waveguide, the fabrication, positioning, alignment, and tolerancing of the conducting ridge renders the manufacture and assembly of the part complex and impractical for volume manufacturing.

Another known conversion is disclosed in MTT-S 1998 International Microwave Symposium Digest paper entitled "A Novel Coplanar Transmission Line to Rectangular Waveguide" by Simon, Werthen, and Wolff. The transformer comprises a microstrip line supported by a dielectric substrate. On an opposite side of the substrate, there are two printed conductive patches positioned in a waveguide cavity. The signal travelling in the microstrip induces a current in the patches that is coupled to the other patch. By proper choice of the patch separation constructive interference of the RF signal is achieved in the waveguide. Disadvantageously, the structure disclosed has significant insertion loss at higher frequencies and a relatively narrow bandwidth of operation. Although the disclosed design has a simpler structure than the other prior art transformers, it is relatively sensitive to manufacturing tolerances and operating environment. In addition, the transition also exhibits higher radiation and thereby reduced isolation and increased loss.

Another challenge associated with the launch of a signal present on a MIC to a wireless communication signal is that there is a significant impedance mismatch between a conventional 50 ohm transmission line and a much higher 377 ohms impedance in free space. Impedance mismatch results in a reduction of system bandwidth, which compromises the capability of the system to support high speed transmissions. Conventionally, a series of impedance steps is designed into a system to gradually transition a low impedance transmission medium to the final high impedance transmission medium. The gentler the taper, the better the match, and the greater the system bandwidth. Disadvantageously, the gentler the taper, the greater the amount of physical space is needed to accommodate the taper and the larger the overall system. There is a need, therefore, for a method of tapering the impedance mismatch from a transmission line to a radiating waveguide, which occupies a minimum amount of space while preserving adequate bandwidth.

There remains a need for a broadband manufacturable microstrip to waveguide transition for high frequency MICs and microwave multichip modules.

SUMMARY

It is an object of an embodiment according to the teachings of the present invention to provide a transition from a planar transmission line signal to a waveguide signal and then to a radiated signal in air that is simply manufactured and relatively insensitive to manufacturing tolerances.

A transition from a planar transmission line to a waveguide comprises a planar transmission line disposed on a substrate and a mode transformer to convert a transverse electric or quasi-transverse electric mode signal carried by the transmission line to a waveguide mode signal. A first impedance matching element comprises a combination of a first extension of the substrate and a dielectric portion having a first depth. A second impedance matching element comprises a combination of a second extension of the substrate and a dielectric portion having a second depth, the second depth being greater than the first depth.

It is a feature of an embodiment according to the teachings of the present invention that a substrate on which an IC can be disposed also comprises a portion of an impedance matching element for converting a signal traveling in a planar transmission line to a signal appropriate for wireless communication.

It is a feature of an embodiment according to the teachings of the present invention that practical use of the substrate as both substrate and impedance match element provides a compact design with acceptable RF loss performance.

It is an advantage of an embodiment according to the teachings of the present invention that a vertically oriented waveguide can be realized using conventional planar manufacturing techniques.

It is an advantage of an embodiment according to the teachings of the present invention that a broadband millimeter wave waveguide transition can be realized using relatively low cost manufacturing techniques.

DETAILED DESCRIPTION

Figure 1:
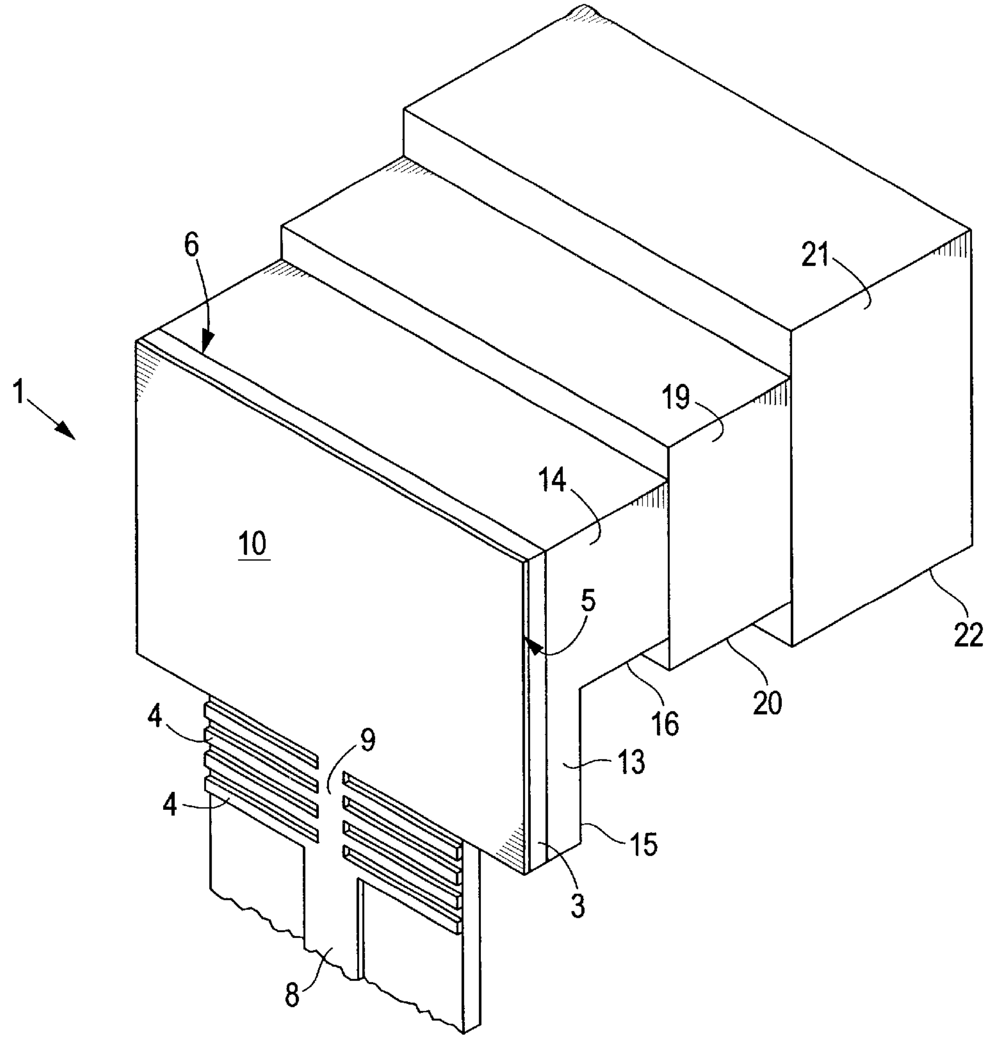
FIG. 1 is a perspective view of a transition from a planar transmission line to a waveguide in accordance with the present invention.
Figure 3:
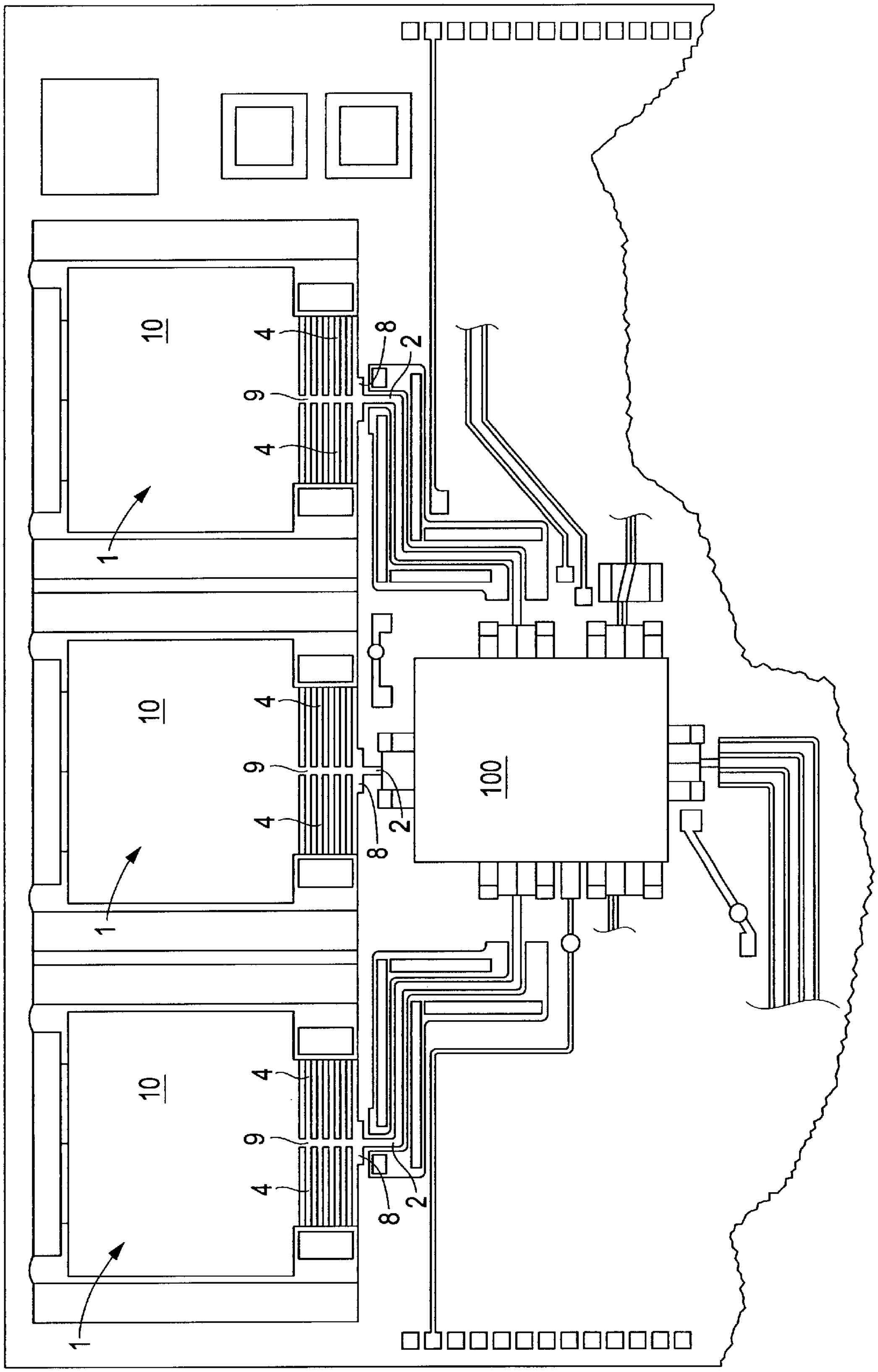
FIG. 3 is a plan view representation of an MIC with three RF ports that benefits from an embodiment according to the teachings of an embodiment of the present invention.

With specific reference to FIGS. 1 and 3 of the drawings, there is shown an embodiment of a transition from a planar transmission line 2 to a waveguide and is suitable for implementation in a packaged MIC 100. The transition is used to convert an electrical signal carried by the planar transmission line 2 to an electrical signal transmitted through waveguide and into the air while maintaining reasonable signal bandwidth.

The planar transmission line 2 is electrically coupled to a mode transformer 1 by way of a standard metal trace made continuous with a quasi-TEM portion 8 of the transformer. Other methods of electrical connection are also acceptable. The transformer 1 comprises a 5 mil thick glass substrate 3 which is patterned with an electrically conductive material, for example sputtered or plated gold or copper, on all minor edges. Transforming fins 4, which are patterned electrically conductive material onto the glass substrate 3, operate to convert a quasi-TEM or transverse electric mode signal carried by the planar transmission line 2 to a waveguide mode in the glass substrate 3. The mode transformer 1 is more fully described in copending U.S. patent application Ser. No. 09/144,124, the contents of which are incorporated herein by reference. In the mode transformer so described a TEM or quasi-TEM signal in planar transmission line is converted to a signal traveling in waveguide and the substrate on which the planar transmission line is disposed acts as the waveguide in which the waveguide mode signal propagates.

A transformer used in an embodiment of a microwave transition in accordance with the present invention comprises glass substrate 3 which is plated with a conductive material on all minor sides. An acceptable conductive material for this purpose is, for example, sputtered or plated gold or copper. A first major surface 5 of the transformer comprises the quasi-TEM portion 8, a conversion portion 9, and a rectangular mode portion 10. A second major surface 6 is also covered with the conductive material except for a rectangular portion that comprises the waveguide access port 7. The waveguide access port 7 exposes a rectangular section of the glass substrate 3 permitting RF, microwave or millimeter wavelength energy to radiate through it. As an example, the dimensions of the access port 7 are 2300 microns by 1994 microns. The impedance differential of the glass substrate 3 waveguide relative to air is relatively large for purposes of impedance matching and broadband operation of the transition. Accordingly, there is a need for a broadband transition from the waveguide access port 7 to air. The transition between the glass substrate 3 acting as a waveguide and air occurs through ports 12 in carrier 11. In the disclosed embodiment, the carrier 11 is metal and is held at reference potential, or ground. The carrier 11 makes an enclosure for the IC 100 and has three separate ones of the ports 12 through which, microwave energy is channeled into the air. Each port 12 comprises a series of graduated openings in the carrier 11 going from smaller in size proximate to an internal side 17 of the package to larger in size proximate to an external side 18 of the package. The transformer 1 is placed on a surface of the carrier 11 so that the access port 7 is juxtaposed to one of the ports 12 in the carrier 11. Advantageously, conventional planar manufacturing techniques can be used to create the vertical structure according to the teachings of the present invention.

Figure 2:
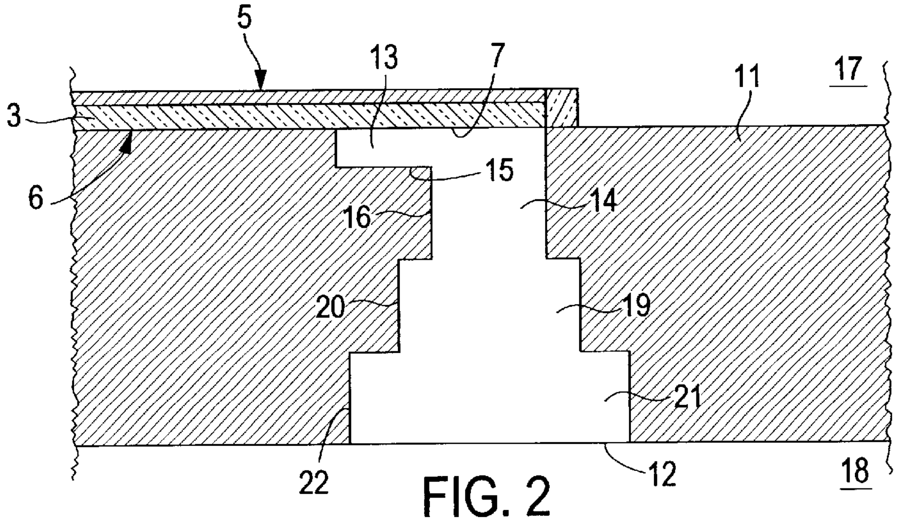
FIG. 2 is a cross sectional view of the transition shown in FIG. 1.

With specific reference to FIG. 2 of the drawings, there is shown a vertical portion of the impedance transition structure according to the teachings of the present invention. A first impedance matching element 13 in the vertical structure comprises an extension of the glass substrate 3 in combination with a first recessed portion 15 of the carrier 11. Because the carrier 11 is metal, the walls that bound the dimensions of the first recessed portion 15 are electrically conductive forming a waveguide within the carrier 11. With reference to FIGS. 1 and 2 of the drawings, the first recessed portion 15 has substantially the same width as the transformer 1 and the access port 7, for example 2300 microns, and a depth dimension of the same order of magnitude as the thickness of the glass substrate 3, for example 169 microns. Accordingly, a wall that bounds the width of the first impedance matching element 13 is substantially planar when transitioning from glass to air dielectric. As one of ordinary skill in the art will appreciate, the ratio of the impedance of the glass waveguide relative to the glass/air waveguide comprising the first impedance matching element 13 having the given dimensions is approximately 1:5. Adjacent the first impedance matching element 13 is a second impedance matching element 14 comprising a combination of a second extension of the glass substrate 3 and a second recessed portion 16 in the carrier 11. The second recessed portion 16 has a width dimension substantially equal to the width of the access port 7, for example 2300 microns, and a depth dimension larger that the depth of the first recessed portion 15, for example 1007 microns. Accordingly, a wall the bounds the width of the second impedance element is substantially planar with the first impedance element 13. As one of ordinary skill in the art will appreciate, the ratio of impedance of the first impedance matching element 13 relative to the second impedance matching element 14 is approximately 1:4. The first and second impedance matching elements 13, 14 together comprise a transition for a waveguide mode electrical signal radiating through a glass filled waveguide to a signal radiating through a waveguide in air. Alternatively, the transformer may transition into a different dielectric that is not air. If a dielectric other than air is used, the relative dimensions of the impedance matching elements should be adjusted for optimum performance. Conceptually, two of the dimensions of the first and second impedance matching elements 13, 14 are substantially the same, while the depth dimension is varied to step the impedance from one value to a slightly higher value.

Specifically, the widths of the first and second impedance matching elements 13, 14 are both substantially 2300 microns, and the heights of the first and second impedance matching elements 13,14 are 994 microns and 1000 microns respectively. Accordingly, the access port 7, covers both the first and second impedance matching elements 13,14 and the length dimension of each element is substantially the same although not necessarily identical. The vertical transition together with the transformer provides a transition from an electrical signal conducted in planar transmission line to a signal radiating through waveguide. The graduated impedance transitions provide for reasonable broadband operation through the transition. A third impedance matching element 19 may be used to step the impedance still further and further improve the transition from the waveguide to air. The third impedance matching element 19 comprises a third recessed portion 20 adjacent the second impedance matching element 14. The third recessed portion 20 of the carrier 11 has the same width as the first and second impedance matching elements 13,14 and a depth larger than the depth of the second impedance matching element 14, for example 1080 microns. The third impedance matching element 19 is also larger in height, for example 1460 microns. Alternatively, it is also possible to realize additional tuning by optimizing a depth or width or both of the glass waveguide 3.

Figure 4:
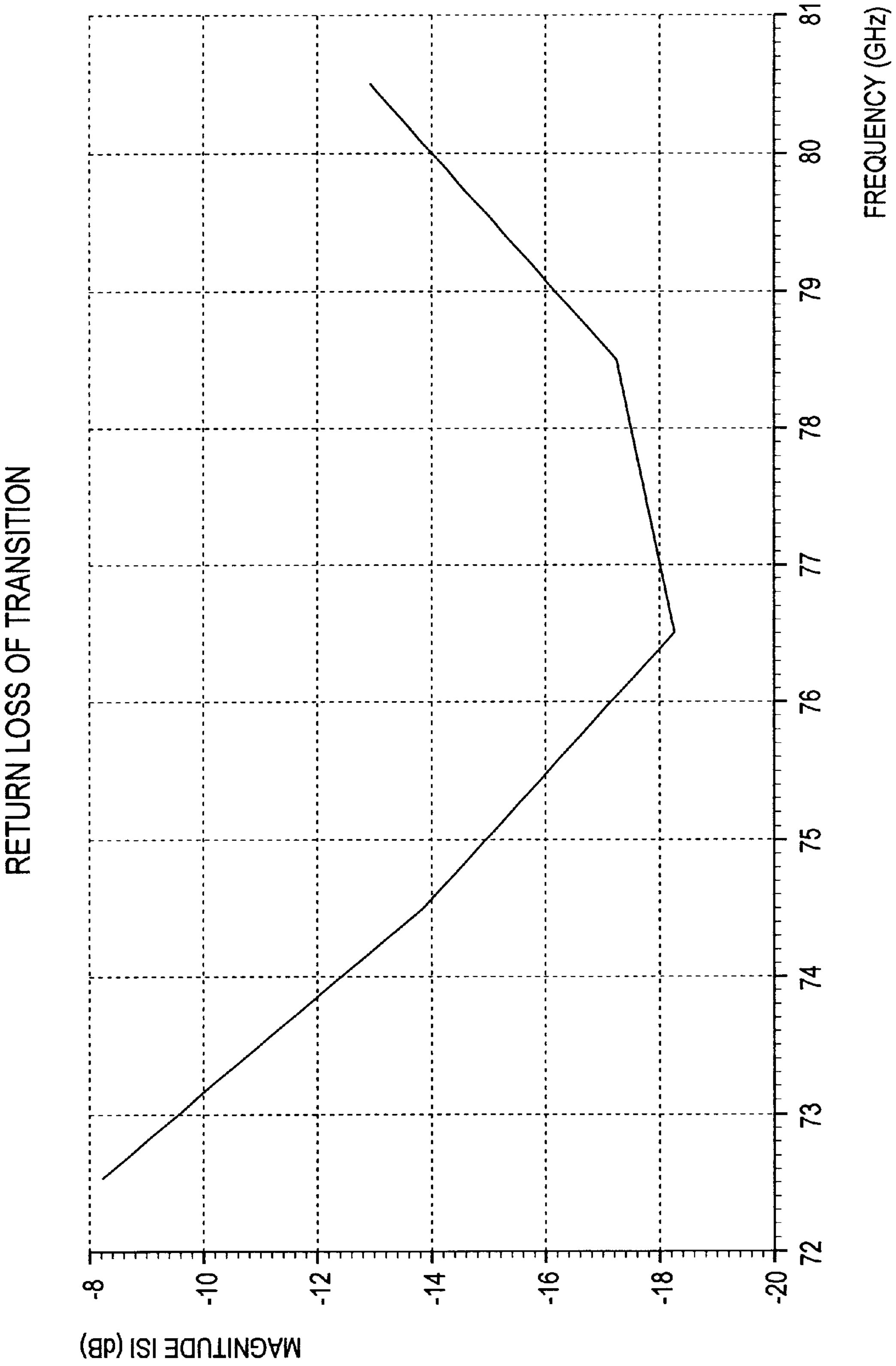
FIG. 4 is a graph showing return loss vs. frequency of the transition in accordance with the present invention.

For further impedance match between the third impedance matching element 19 and air, a fourth impedance matching element 21 may be used. The fourth impedance matching element 21 comprises a fourth recessed portion 22 of the carrier 11 having a width substantially similar to the widths of the first, second, and third impedance matching elements 13,14, 19, for example 2300 microns. It has a depth larger that the depth of the third impedance matching element, for example 1413 microns and a larger height than the third impedance matching element 19, for example 2300 microns. The third and fourth impedance matching elements 19, 21 are included for a more gradual match between the second impedance matching element 14 and air, but are not an essential part of the present invention. Additional impedance elements of graduated size that enlarge as the elements are positioned further away from the first and second impedance matching elements 13,14 and internal side 17 of the package may be implemented according to the judgement of one of ordinary skill in the art. Alternatively, an enlarging taper or conical arrangement may also be used. FIG. 4 illustrates a return loss of transition plotted against frequency illustrating that no loss other than radiation is present.

It is possible to use the concept described above by way of example, wherein the dimension of the access port 12 is given as a boundary condition in an optimizer, for example Ansoft's Maxwell Eminence with EMPipe3D Optimizer. When using the optimizer, the first and second impedance matching elements are established with one or more of the dimensions given as variables with an initial value, and the remaining dimensions given as fixed boundary conditions. Additional impedance match elements can also be established for improved performance. The optimizer calculates the impedance for each impedance element at the initial values and further calculates a resulting frequency response. The optimizer adjusts the variable dimensions and recalculates the impedances and resulting frequency response. The optimizer makes adjustments automatically and optimizes the variable dimensions to fit a desired frequency response. The result is a waveguide transition with acceptable frequency response for a given frequency range.

The foregoing disclosure is meant to be illustrative of the teachings of the present invention and does not limit the scope of the present invention. Other embodiments are apparent to one of ordinary skill in the art that are within the scope of the appended claims.

What is claimed is:

1. A transition from a planar transmission line to a waveguide comprising:

a planar transmission line disposed on a substrate, a mode transformer to convert a transverse electric or quasi-transverse electric mode signal carried by said transmission line to a waveguide mode signal, a first impedance matching element comprising a combination of a first extension of said substrate and a dielectric portion having a first depth, a first height and a first width, and a second impedance matching element comprising a combination of a second extension of said substrate and a dielectric portion having a second depth, a second height and a second width, said second depth being greater than said first depth and at least one of said first height or said first width being less than said second height or said second width, as the case may be.

2. A transition from a planar transmission line to waveguide as recited in claim 1 and further comprising a third impedance matching element having a third depth greater than said second depth.

3. A transition from a planar transmission line to waveguide as recited in claim 2 and further comprising one or more additional impedance matching elements having respective heights of graduated size enlarging as said elements are positioned further from said first and second impedance matching elements.

4. A transition from a planar transmission line to waveguide as recited in claim 2, said third impedance matching element comprising a conical waveguide.

5. A transition from a planar transmission line to waveguide as recited in claim 1 wherein said substrate is glass.

6. A transition from a planar transmission line to waveguide as recited in claim 1 wherein said dielectric is air.

7. A transition from a planar transmission line to waveguide as recited in claim 1 wherein said second depth is approximately twice that of said first depth.

8. A method of creating a waveguide transition comprising the steps of:

establishing two or more impedance matching elements having at least two variable dimensions with an initial values, said impedance matching elements having fixed values for dimensions that remain, establishing a desired frequency response for the transition, calculating the impedance of the impedance match elements, calculating a frequency response from the calculated impedance values, adjusting the variable dimensions to most closely approach the desired frequency response, and fabricating a transition according to the resulting dimensions that most closely achieves the desired frequency response.

9. A method of creating a waveguide transition as recited in claim 8 and further comprising the step of establishing a variable to a width of the glass waveguide for use in the steps of calculating and adjusting.

10. A method of creating a waveguide transition as recited in claim 8 and further comprising the step of establishing a variable to a depth of the glass waveguide for use in the steps of calculating and adjusting.

11. A method of creating a waveguide transition as recited in claim 8 and further comprising the step of establishing variables for a width and a depth of the glass waveguide for use in the steps of calculating and adjusting.

12. A waveguide to waveguide transition comprising:

a first impedance matching element comprising a combination of a first extension of a first waveguide and a dielectric portion having a first depth, a first width and a first height, and a second impedance matching element comprising a combination of a second extension of said first waveguide and a dielectric portion having a second depth, a second width and a second height, said second depth being greater than said first depth and at least one of said second height or second width being less than said first height or width, as the case may be.

* * * * *